(12) United States Patent
St-Germain

(10) Patent No.: US 6,624,638 B2
(45) Date of Patent: Sep. 23, 2003

(54) METHOD AND DEVICE FOR REMOTE MONITORING OF LED LAMPS

(75) Inventor: Nicolas St-Germain, St-Bruno (CA)

(73) Assignee: Gelcore, LLC, Valley View, OH (US)

( * ) Notice: Subject to any disclaimer, the term of this patent is extended or adjusted under 35 U.S.C. 154(b) by 0 days.

(21) Appl. No.: 10/263,325

(22) Filed: Oct. 2, 2002

(65) Prior Publication Data

US 2003/0042914 A1 Mar. 6, 2003

Related U.S. Application Data

(63) Continuation of application No. 09/996,300, filed on Nov. 28, 2001, which is a continuation-in-part of application No. 09/543,240, filed on Apr. 5, 2000, now abandoned.

(30) Foreign Application Priority Data

Nov. 19, 1999 (CA) .............................................. 2290203

(51) Int. Cl.[7] .............................................. G01R 31/00
(52) U.S. Cl. ....................... 324/500; 324/550; 340/638; 361/57
(58) Field of Search ................................ 340/638, 641, 340/661, 664, 907, 912; 315/291, 302, 307, 308; 368/89; 361/57, 56, 104, 119, 124, 125, 127; 324/500, 522, 537, 550, 424, 769

(56) References Cited

U.S. PATENT DOCUMENTS 5,663,719 A * 9/1997 Deese et al. ................. 340/912
6,150,771 A * 11/2000 Perry .......................... 315/291

FOREIGN PATENT DOCUMENTS

| CA | 2225005 | 12/1997 | |
|---|---|---|---|
| FR | 2 724 749 | 3/1996 | |
| WO | 99/07186 | 2/1999 | ............ H05B/33/08 |
| WO | 99/56504 | 11/1999 | ............ H05B/3/08 |

* cited by examiner

Primary Examiner—N. Le
Assistant Examiner—Vincent Q. Nguyen
(74) Attorney, Agent, or Firm—Darby & Darby

(57) ABSTRACT

LED lamp circuitry that emulates an incandescent lamp's behavior upon remote verification of the LED lamp. The invention presents a fuse blow-out circuit and a cold filament detection circuit permitting the use of LED lamps in applications, such as railway signal light applications, where there is a need for remote monitoring of the lamps, while keeping the advantageous features of lower power consumption and longer life. The invention also provides a control circuit for enabling/disabling the power supply to LED lamps in relation to the level of the line voltage. The advantage of this embodiment is to avoid unwanted functioning of the LED lamp caused by interference from surrounding electrical cables.

6 Claims, 4 Drawing Sheets

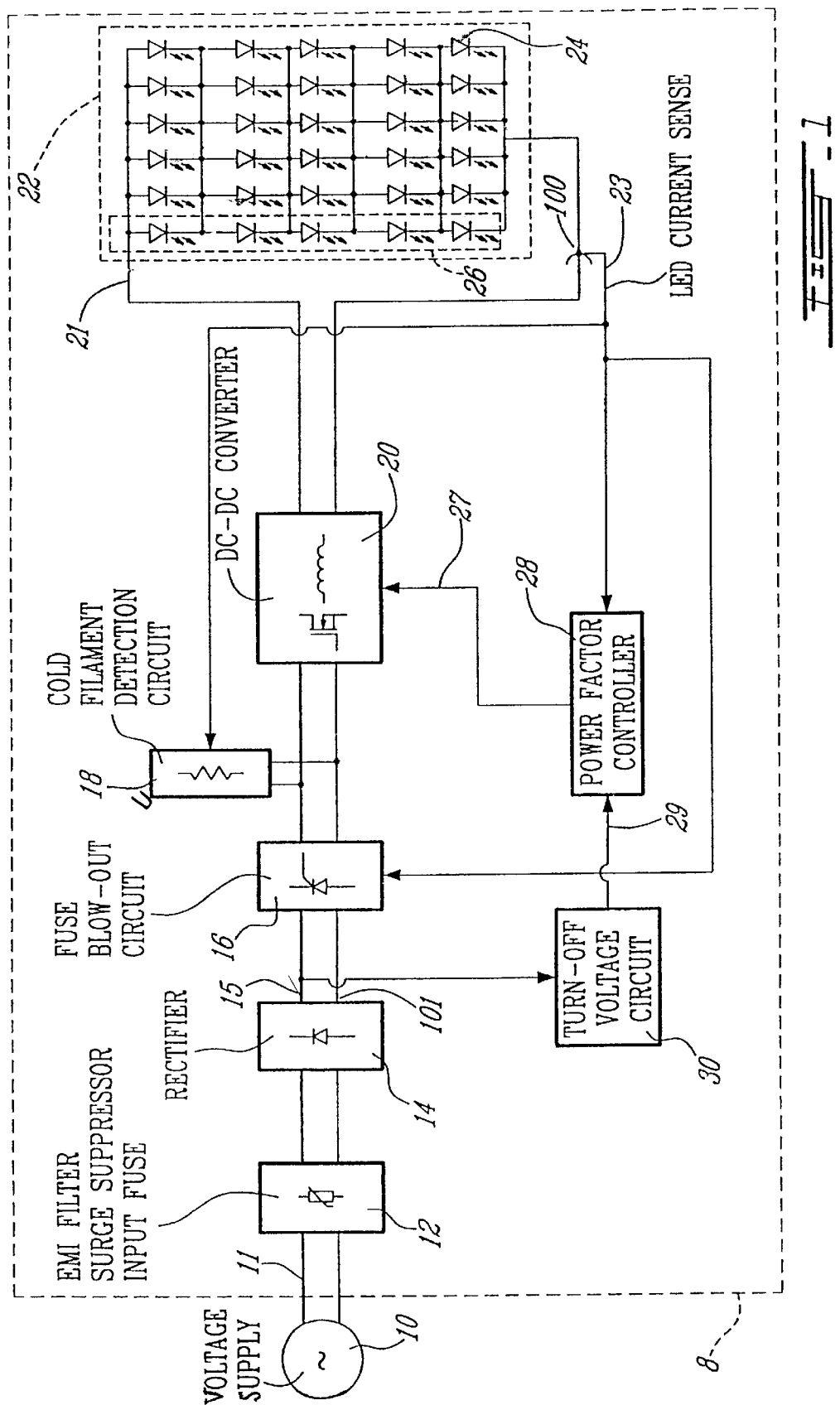

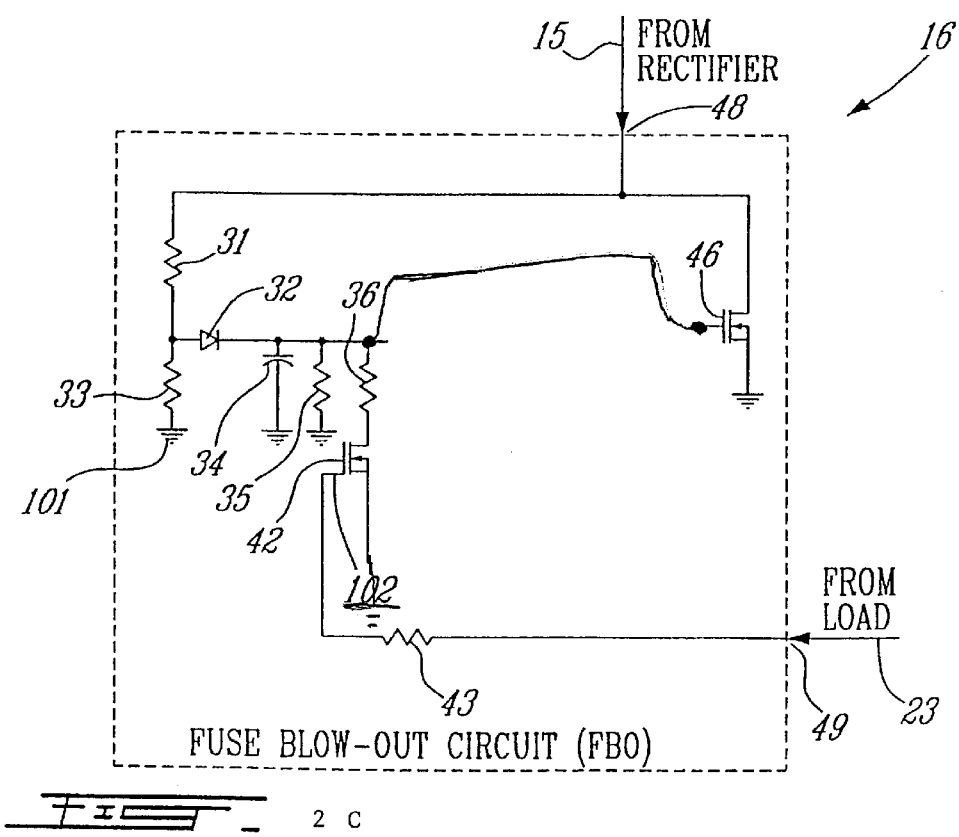

METHOD AND DEVICE FOR REMOTE MONITORING OF LED LAMPS

RELATED APPLICATION

This is a continuation, of application Ser. No. 09/996,300, filed Nov. 28, 2001, which is a continuation-in-part of U.S. application Ser. No. 09/543,240 filed Apr. 5, 2000 now abandoned. Each of these prior applications is hereby incorporated herein by reference, in its entirety.

FIELD OF THE INVENTION

The present invention relates to the electric supply of light-emitting loads, in particular light-emitting diode (LED) lamps. More specifically, the present invention is concerned with electric circuits and methods required for remote monitoring of LED lamps.

BACKGROUND OF THE INVENTION

Light-emitting diode (LED) lamps are becoming more and more popular in automotive traffic lights, railway signal lights and other applications Their lower power consumption is an attractive feature, but the main reason for their popularity is their long life (100 000 hours) compared to standard incandescent lamps (5 000 hours). Manifestly, these features allow important reduction in maintenance costs.

In certain applications, such as railway signal lights, these lamps may be used, as those skilled in the art would know, for main line signalling and/or grade crossing signaling. Grade crossing signals are usually situated in populated areas such as road intersections. Remote monitoring of the LED lamps in grade crossing signals is therefore not necessary. Main line signals, on the other hand, can be installed in remote areas, which are not easily accessible. Remote monitoring for checking the integrity of the lamps signals is therefore common practice.

For lamps equipped with standard incandescent bulb, electrical integrity can be easily verified. If the filament of the incandescent bulb is in normal condition, current flows through the bulb according to Ohm's law (I=V/R). Otherwise, if the filament is open, no current flows through the bulb and it should be replaced.

For LED lamps, however, LED current is controlled by a power supply. Current characteristics are therefore not identical in a LED lamp and in an incandescent lamp. In a LED lamp, alternative current (ac) line voltage is rectified and then converted to a suitable level by a dc—dc (direct current) converter, which also regulates LED current. In case of LED failure, or failure of any other electrical component in the LED lamp, it is possible for the power supply to continue drawing current at or near the nominal current value, even if the LED's are not emitting any light. Remote monitoring systems could therefore see the LED lamp as functioning correctly when in reality it is not. This situation is not acceptable since it can lead to very hazardous train operations and cause major accidents.

Another problem, related to LED lamps and their power supplies and controllers, is caused by electric components which retain residual voltage differentials after power is removed from the LED lamp. The resulting characteristic is that a LED lamp will effectively light up when the power applied to it reaches a first high level while it will be turned off only when the power reaches a second lower level. The resulting problem is that if a certain power is induced by, for example, other nearby cables, the LED lamp could remain on while in fact it should be off. This could also lead to dangerous situations.

These particularities of LED lamps limit their widespread use in situations where they need to be remotely monitored such as in railway main line signalling applications.

OBJECTS OF THE INVENTION

An object of the present invention is therefore to allow LED lamps to become compatible with remote detection systems designed for monitoring of incandescent lamps.

Another object of the invention is to provide LED lamp circuitry which will emulate an incandescent lamp's behaviour upon remote monitoring of the LED lamp.

Yet another object of the invention is to provide a control circuit for enabling/disabling the power supply to LED lamps in relation to the level of the line voltage.

SUMMARY OF THE INVENTION

More specifically, in accordance with the present invention, there is provided a fuse blow-out circuit for establishing a short circuit between first and second voltage and current supply lines to blow out a protection fuse through which a current supplied to a light-emitting load by the first and second lines flows, this fuse blow-out circuit comprises:

a timer means responsive to the voltage across the first and second lines for producing a time-representative signal after a certain period of time;

means connected to the timer means for preventing production of the time-representative signal in response to the current supplied to the light-emitting load; and means for establishing a current path between the first and second lines in response to the time-representative signal.

Accordingly, when no current is supplied to the light-emitting load, the current path is established and provides the short circuit between the first and second lines that will blow out the protection fuse and emulate an open circuit of a defective incandescent lamp.

Also in accordance with the present invention, there is provided a fuse blow-out circuit for establishing a short circuit between first and second voltage and current supply lines to blow out a protection fuse through which a current supplied to a light-emitting load by the first and second lines flows. This fuse blow-out circuit comprises:

a resistor and a capacitor connected in series between the first and second lines, this resistor having a given resistance value, and this capacitor having a given capacitance value and a capacitor charge period dependent on the given resistance value and the given capacitance value;

a trigger circuit connected in parallel with the capacitor, and comprising a first controllable switch member closed in response to the current supplied to the light-emitting load to discharge the capacitor; and a second controllable switch member defining a current path between the first and second lines and closed in response to a given voltage amplitude across the capacitor.

Therefore, in the absence of current supplied to the light-emitting load for a duration equivalent to the capacitor charge period, the given voltage amplitude across the capacitor is reached to thereby close the second switch member, establish the current path and provide the short circuit between the first and second lines that will blow out the protection fuse and emulate an open circuit of a defective incandescent lamp.

Further in accordance with the present invention, there is provided a power supply unit responsive to alternating voltage and current from an ac source for supplying a dc voltage and current to a light-emitting load, comprising:

a rectifier unit rectifying the alternating voltage and current from the ac source and supplying the rectified voltage and current to first and second voltage and current supply lines;

a protection fuse through which the alternating current from the ac source is supplied to the rectifier unit;

a converter of the rectified voltage and current into the dc voltage and current supplied to the light-emitting load;

a fuse blow-out circuit as described above, for establishing a short circuit between the first and second voltage and current supply lines to blow out the protection fuse; and a controller of the converter in response to the rectified voltage on the first and second lines.

The present invention also relates to a cold filament detection circuit connected between first and second lines through which a voltage and current supply source supplies voltage and current to a light-emitting load, the voltage and current supply source having a set up time during which no current is supplied to the light-emitting load. This cold filament detection circuit comprises:

a resistor;

means for connecting the resistor between the first and second lines in response to the voltage on the first and second lines to thereby establish through this resistor a current path between the first and second lines; and means for disconnecting the resistor from between the first and second lines in response to the current supplied to the light-emitting load.

Accordingly, during the set up time no current is supplied to the light-emitting load and the current path is established through the resistor to emulate the impedance of an incandescent lamp, and when current is supplied to the light-emitting load, the resistor is disconnected from between the first and second lines.

The present invention further relates to a cold filament detection circuit connected between first and second lines through which a voltage and current supply source supplies voltage and current to a light-emitting load, the voltage and current supply source having a set up time during which no current is supplied to the light-emitting load. The cold filament detection circuit comprises:

a resistor;

a controllable switch member: connected in series with the resistor between the first and second lines; responsive to the voltage on the first and second lines; and having a current-conductive junction established in response to the voltage on the first and second lines to thereby establish through the resistor a current path between the first and second lines; and a switch control unit responsive to the current supplied to the light-emitting load, connected to the first controllable switch member, and having a switch-disabling circuit which prevents the current-conductive junction to establish as long as current is supplied to the light-emitting load.

In operation, during the set up time no current is supplied to the light-emitting load and the current path is established through the resistor to emulate the impedance of an incandescent lamp, and when current is supplied to the light-emitting load, the switch-disabling circuit prevents the current-conductive junction to establish whereby the resistor is disconnected from between the first and second lines.

The present invention still further relates to a voltage and current supply source responsive to alternating voltage and current from an ac source for supplying dc voltage and current to a light-emitting load, comprising:

a rectifier unit rectifying the alternating voltage and current from the ac source and supplying the rectified voltage and current to first and second voltage and current supply lines;

a converter of the rectified voltage and current into the dc voltage and current supplied to the light-emitting load;

a cold filament detection circuit as defined above, connected between the first and second lines through which the voltage and current supply source supplies voltage and current to the light-emitting load; and a controller of the converter in response to the rectified voltage on the first and second lines.

The present invention is also concerned with a voltage control circuit for controlling the amplitude of a voltage signal on a control terminal of a power controller unit itself controlling a voltage and current supply source which supplies a current to a light-emitting load through first and second voltage and current supply lines. This voltage control circuit comprises:

means for producing a first trigger voltage in response to the voltage across the first and second lines, this first trigger voltage having an amplitude representative of the amplitude of the voltage across the first and second lines;

first switch means, connected in series with a high impedance element between the control terminal and one of the first and second lines, for establishing a high impedance current path between the control terminal and said one line when the first trigger voltage reaches a given amplitude, wherein the first switch means comprises means for producing a second trigger voltage having a first amplitude when the high impedance current path is not established and a second amplitude when the high impedance current path is established; and second switch means, connected in series with a low impedance element between the control terminal and said one line, for establishing a low impedance current path between the control terminal and said one line when the second trigger voltage has the first amplitude.

Accordingly, when the first trigger voltage has an amplitude lower than the given amplitude, the high impedance current path is not established, a second trigger voltage of first amplitude is produced, and the low impedance current path is established to result in a voltage signal amplitude on the control terminal which disables the power controller unit and, when the amplitude of the first trigger voltage reaches the given amplitude, the high impedance current path is established, a second trigger voltage of second amplitude is produced, and the low impedance current path is not established to result in a voltage signal amplitude on the control terminal which enables said power controller unit.

The present invention is further concerned with a voltage control circuit for controlling the amplitude of a voltage signal on a control terminal of a power controller unit itself controlling a voltage and current supply source which supplies a current to a light-emitting load through first and second voltage and current supply lines. The voltage control circuit comprises:

a voltage divider circuit connected between the first and second lines and comprising resistors which divide the voltage on the first and second lines to produce a first trigger voltage signal;

a first controllable switch member connected in series with a high impedance element between the control terminal and one of the first and second lines to define a high impedance current path between this control terminal and said one line, this first controllable switch member being responsive to the first trigger voltage signal and having a first current-conductive junction established when the first trigger voltage reaches a given amplitude, wherein the high impedance current path produces a second trigger voltage having a first amplitude when the first current-conductive junction is not established and a second amplitude when the first current-conductive junction is established; and a second controllable switch member connected in series with a low impedance element between the control terminal and said one line to define a low impedance current path between this control terminal and said one line, this second controllable switch member being responsive to the second trigger voltage and having a second current-conductive junction established when the second trigger voltage has the first amplitude and non established when the second trigger voltage signal has the second amplitude.

Therefore, when the first trigger voltage has an amplitude lower than the given amplitude, the first current-conductive junction is not established to produce in the high impedance current path a second trigger voltage of first amplitude which establishes both the second current-conductive junction and the low impedance current path to result in a voltage signal amplitude on the control terminal which disables the power controller unit and, when the amplitude of the first trigger voltage reaches the given amplitude, both the first current-conductive junction and the high impedance current path are established to produce in the high impedance current path a second trigger voltage of second amplitude whereby both the second current-conductive junction and the low impedance current path are not established to result in a voltage signal amplitude on the control terminal which enables the power controller unit.

The present invention is still further concerned with a voltage and current supply source responsive to alternating voltage and current from an ac source for supplying dc voltage and current to a light-emitting load, comprising:

a rectifier unit rectifying the alternating voltage and current from the ac source and supplying the rectified voltage and current to first and second voltage and current supply lines;

a converter of the rectified voltage and current into the dc voltage and current supplied to the light-emitting load;

a power controller unit having a control terminal and controlling the converter in response to the rectified voltage on the first and second lines; and a voltage control circuit as described above, for controlling the amplitude of a voltage signal on the control terminal of the power controller unit.

The embodiments described herein present the advantage that they permit the use of LED lamps in applications, such as railway signal light applications, where there is a need for remote monitoring of the lamps, while keeping the advantageous features of lower power consumption and longer life.

Other objects, advantages and features of the present invention will become more apparent upon reading of the following non-restrictive description of preferred embodiments thereof, given by way of example only with reference to the accompanying drawings.

BRIEF DESCRIPTION OF THE DRAWINGS

In the appended drawings:

FIG. 1 is a schematic block diagram showing a LED lamp assembly including a fuse blow-out circuit, a cold filament detection circuit, and a turn-off voltage circuit;

FIG. 2C is a schematic electrical circuit diagram of a third embodiment of the fuse blow-out circuit according to the invention;

DETAILED DESCRIPTION OF THE PREFERRED EMBODIMENTS

Figure 2A:
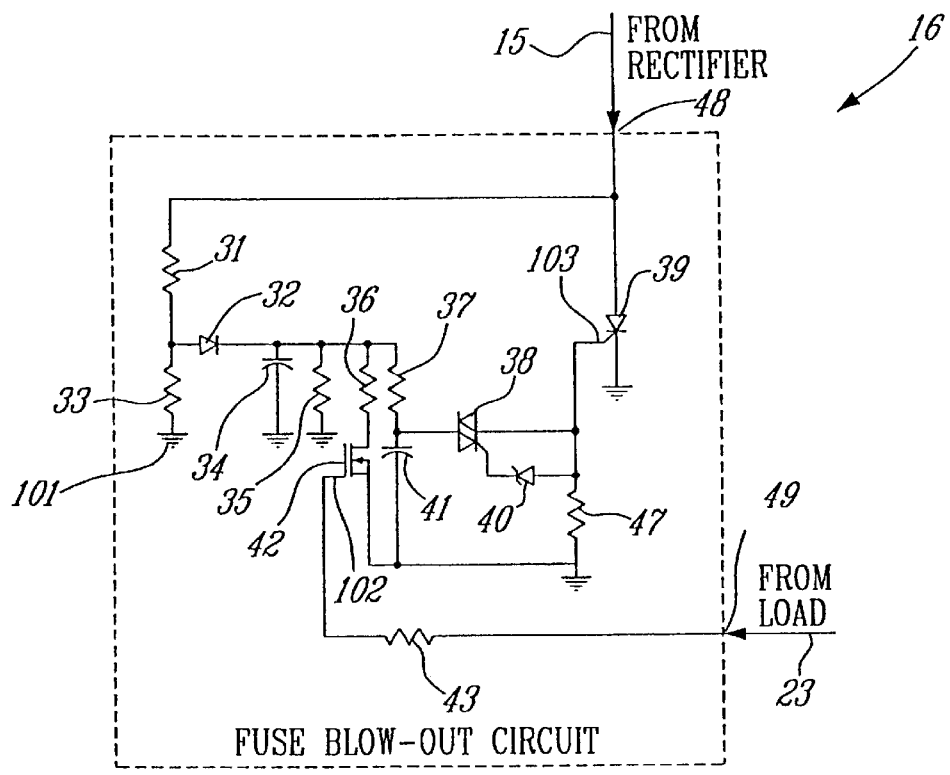
FIG. 2A is a schematic electrical circuit diagram of a first embodiment of a fuse blow-out circuit according to the invention.

Referring to FIG. 1, an ac (alternating current) line voltage is supplied to a LED lamp B by a voltage and current supply source 10 through a line 11. The AC line voltage is EMI (Electromagnetic Interference) filtered and surge suppressed by means of functional block 12 including an EMI filter, a surge suppressor and an input fuse. Then, the line voltage is rectified through a rectifier 14 and subsequently converted to a DC voltage through a DC—DC converter 20. The DC voltage from the converter 20 is supplied on line 21 to light up a series/parallel LED (light-emitting diodes) array 22. LEDs are also more generally referred to in the present specification as light-emitting loads.

The current flowing through the series/parallel LED array 22 is sensed by a current sensor 100. This current sensor 100 produces a LED current sense signal 23 supplied to a power factor controller 28. The function of the power factor controller 28 is to control the DC—DC converter 20 through a line 27, which in turn controls the DC current and voltage on line 21.

In the illustrated example, the series/parallel LED array 22 is formed of a plurality of subsets 26 of five (5) serially interconnected light-emitting diodes 24. Each subset 26 of serially interconnected light-emitting diodes 24 are connected in parallel to form the series/parallel LED array 22. A particularity is that the anodes of the first light-emitting diodes of the subsets 26 are interconnected, the cathodes the first light-emitting diodes of the subsets 26 and the anodes of the second light-emitting diodes of the subsets 26 are interconnected, the cathodes of the second light-emitting diodes of the subsets 26 and the anodes of the third light-emitting diodes of the subsets 26 are interconnected, the cathodes of the third light-emitting diodes of the subsets 26 and the anodes of fourth light-emitting diodes of the subsets 26 are interconnected, the cathodes of the fourth light-emitting diodes of the subsets 26 and the anodes of the fifth light-emitting diodes of the subsets 26 are interconnected, and the cathodes of the fifth light-emitting diodes of the subsets 26 are interconnected. Of course, other types of arrangements comprising various numbers of LEDs are possible within the scope of the present invention.

Various embodiments of EMI filter (block 12), surge suppressor (block 12), input fuse (block 12), rectifier 14 and DC—DC converter 20 can be used. These embodiments are well known to those of ordinary skill in the art and, accordingly, will not be further described in the present specification. Also, in a preferred embodiment of the invention, a Motorola® MC33262P integrated circuit (IC) chip is used as power factor controller 28. However, it is within the scope of the present invention to use other IC chips commercially available on the market, or that will become available on the market in the future.

FIG. 1 shows a fuse blow-out circuit 16, a cold filament detection circuit 18 and a turn-off voltage circuit 30. These circuits will be described in greater detail hereinafter.

Fuse Blow-Out Circuit

Referring to FIG. 2A, a first embodiment of the fuse blow-out circuit is shown and generally designated by the reference 16. The fuse blow-out circuit 16 receives the rectified voltage from output terminal 15 of the rectifier 14 on an input 48. The fuse blow-out circuit 16 also comprises a second input 49 to receive the LED current sense signal 23 from the current sensor 100. As long as no LED current sense signal 23 appears on the input 49, a FET (Field-Effect Transistor) transistor 42 is turned off. While transistor 42 is turned off, capacitor 34 is being charged through resistor 31 and diode 32 from the voltage supplied on the input 48. Concurrently, capacitor 41 is being charged through resistor 31, diode 32 and resistor 37. When the voltage across capacitor 41 reaches the breakdown voltage of Zener diode 40 having its anode grounded through resistor 47 (while transistor 42 is still turned off), silicon bilateral switch (or triac) 38 turns on to supply a current to a trigger electrode 103 of a thyristor 39 to thereby trigger this thyristor 39. Triggering of the thyristor 39 into conduction creates a short-circuit between output terminal 15 of rectifier 14 (see FIGS. 1 and 2A) and a ground output terminal 101 of the same rectifier 14.

This short-circuit will effectively blow out the input fuse of functional block 12, thereby opening the circuit. Detection of that open circuit will indicate that the lamp is defective thereby emulating the open circuit of a defective incandescent lamp.

It is to be noted that the sequence of events described above will only take place after a given period of time (fuse blow-out time) has lapsed during which no current is sensed by current sensor 100. This given period of time is constant and is dependent on the values of resistor 31, resistor 33, resistor 35 and capacitor 34.

If, on the other hand, a LED current sense signal 23 is supplied to the input 49 prior to the end of the above mentioned given period of time, this LED current sense signal 23 is applied to the gate electrode 102 of FET transistor 42 through resistor 43 to turn this transistor 42 on. Capacitor 41 then discharges to the ground 101 through resistor 36 and the source/drain junction of transistor 42. Accordingly, capacitor 41 will never become fully charged, the breakdown voltage of Zener diode 40 will never be reached, and no short circuit will be created between the terminals 15 and 101 of rectifier 14. Then, the input fuse of functional block 12 will remain intact.

Figure 2B:
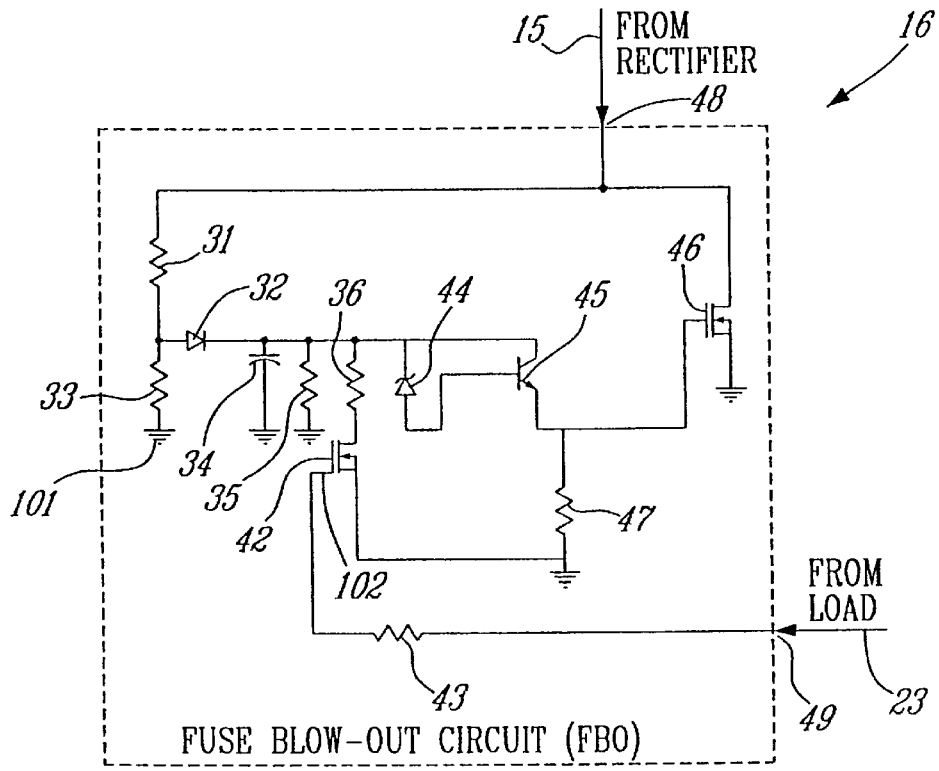
FIG. 2B is a schematic electrical circuit diagram of a second embodiment of the fuse blow-out circuit according to the invention.

Referring to FIG. 2B, a second embodiment of the fuse blow-out circuit is shown and still designated by the reference 16. Again, the fuse blow-out circuit 16 comprises the input 48 to receive the rectified voltage from terminal 15 of the rectifier 14. The fuse blow-out circuit 16 also comprises the second input 49 receiving the LED current sense signal 23 from the current sensor 100 (FIG. 1). As long as no LED current sense signal 23 appears on the input 491 FET transistor 42 is turned off, when transistor 42 is turned off, capacitor 34 is being charged through resistor 31 and diode 32 from the voltage supplied on the input 48, when the voltage across the capacitor 34 reaches the breakdown voltage of the Zener 30 diode 44, (while transistor 42 is still turned off) Zener diode 44 starts conducting current. A current is then supplied to the base of a PNP transistor 45 through resistor 31, diode 32 and Zener diode 44 to turn this transistor 45 on. When turned on, the collector/emitter junction of the transistor 45 becomes conductive to supply a current to the gate electrode of a FET transistor 46. This turns the FET transistor 46 on to establish a short circuit between output terminals 15 and 101 of the rectifier 14 through the source/drain junction of the FET transistor 46. As illustrated, the emitter of the transistor 45 and the gate electrode of the transistor 46 are both connected to the ground through a resistor 47.

Alternatively, as shown in FIG. 2C, the Zener diode 44, transistor 45 and resistor 47 have been removed, and resistor 36 connected to the base of transistor 46.

This short circuit will effectively blow out the input fuse of block 12, thereby opening the circuit. Detection of that open circuit will indicate that the LED lamp 8 is defective thereby emulating the open circuit of a defective incandescent lamp.

It should be noted that the sequence of events described above will only take place after a given period of time (fuse blow-out time) has lapsed during which no LED current sense signal 23 appears on the input 49. This given period of time is constant and depends on the values of resistor 31, resistor 33, resistor 35 and capacitor 34.

If, on the other hand, the LED current sense signal 23 appears on the input 49 prior to lapsing of the above mentioned given period of time, this signal 23 is supplied to the gate electrode 102 of FET transistor 42 to thereby turn transistor 42 on. This connects the positive terminal of capacitor 34 to ground 101 through resistor 36 to thereby discharge capacitor 34. In this case, the breakdown voltage of Zener diode 44 will never be reached, transistor 45 will remain turned off, and no short circuit will be created between output terminals 15 and 101 of rectifier 14. The input fuse of block 12 will, in this case, remain intact.

It should be noted that the "fuse blow-out time" must be longer than the "LED current set up time". For example, in an embodiment, the LED current set up time is approximately 100 msec. Just a word to specify that the "LED current set up time" is the period of time between switching the LED lamp on and appearance of the LED current sense signal 23 at input 49.

Cold Filament Detection Circuit

Figure 3:
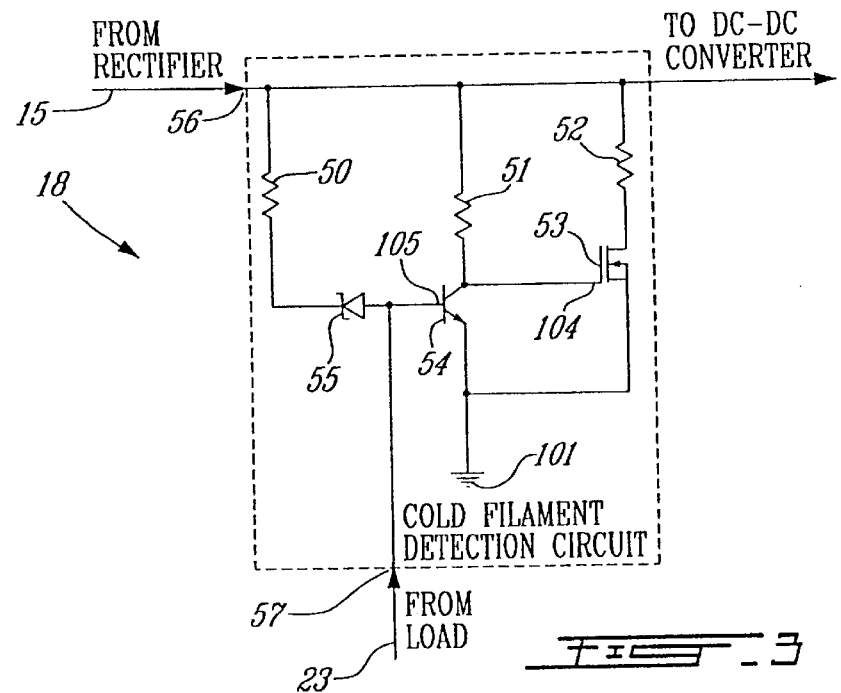
FIG. 3 is a schematic electrical circuit diagram of a cold filament detection circuit in accordance with the present invention.

The cold filament detection circuit 18 of FIG. 3 is used to simulate an incandescent lamp as seen by a lamp proving system. Lamp proving is usually performed by sending a voltage pulse on the voltage supply line 11, and verifying that current rises to a certain level, within a certain period of time. This represents the behaviour of an incandescent lamp, which is equivalent to a simple resistor.

A LED lamp uses a power supply which has a current set up time. Therefore, when sending a pulse on line 11, the current will not rise immediately, but only after the power factor controller 28 is turned on (for example after about 100 msec in an embodiment). The cold filament detection circuit 18 of FIG. 3 solves this problem.

As soon as power is supplied on line 11, the voltage drop across resistor 51, connected between the output terminal 15 (input 56 of the cold filament detection circuit 18) and a gate electrode 104 of a FET transistor, will turn on this transistor 53. This will connect resistor 52 between the output terminals 15 and 101 of the rectifier 14.

When power is applied on line 11 for a period of time which is longer than the LED current set up time, the LED current sense signal 23 will be supplied on an input 57 of the cold filament detection circuit 18. This signal 23 is applied to the base 105 of a PNP transistor 54 to turn on this transistor 54 thereby turning transistor 53 off by forcing its gate electrode 104 to the ground 101. The cold filament detection circuit 18 is thereby disabled to enable the LED lamp 8 to operate normally. Biasing resistor 50 and Zener diode 55 are connected in series between the input 56 and the base electrode 105. Biasing resistor 50 is also used for overvoltage protection.

The cold filament detection circuit 18 also serves as a back up for the fuse blow-out circuit 16. If fuse blow-out circuit 16 was to fail (that is, it does not cause a short circuit to blow out the input fuse of block 12 when in fact it should), transistor 53 would remain turned on since no LED current sense signal 23 would appear on input 57. The current draw through resistor 52 is sufficiently high to blow out the input fuse of block 12 after a certain period of time. For example, in an embodiment of the invention, this time period is of a few minutes.

Turn-Off Voltage Circuit

Figure 4:
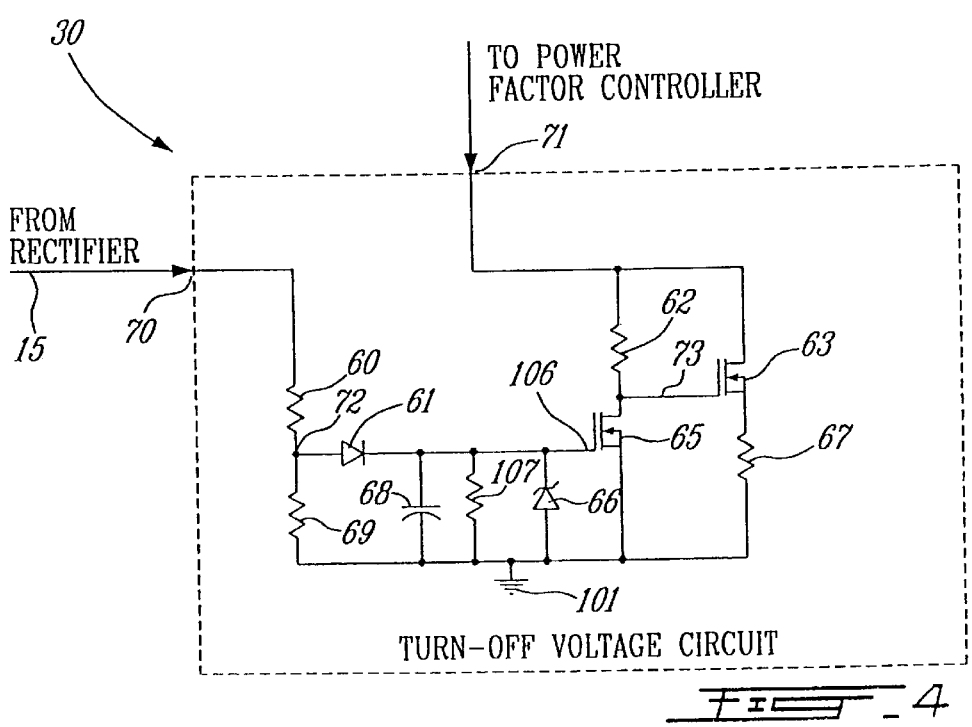
FIG. 4 is a schematic electrical circuit diagram of a turn-off voltage circuit according to the present invention.

The turn-off voltage circuit 30 of FIG. 4 simply inhibits the power factor controller 28 (see FIG. 1) when the input voltage on line 11 of the circuit 30 is below a first predetermined trigger voltage.

The turn-off voltage circuit 30 comprises an input 70 supplied with the voltage on the output terminal 15 of the rectifier 14. The first predetermined trigger voltage 72 is determined by a voltage divider comprising resistors 60 and 69 serially connected between the input 70 of the turn-off voltage circuit 30 and the ground 101. The first predetermined trigger voltage is established after a capacitor 68 has been charged through the resistor 60 and the diode 61, i.e. after a given period of time following application of the voltage on the input 70. This period of time is determined by the values of the resistors 60, 69 and 107 and of the capacitor 68.

The first predetermined trigger voltage 72 is applied to a gate electrode 106 of a FET transistor 65 through the diode 61, when the first trigger voltage 72 reaches the breakdown voltage of the gate electrode 106 of the FET transistor 65, transistor 65 is turned on.

The turn-off voltage circuit 30 comprises a terminal 71 connected to a control terminal 29 of the power factor controller 28. Before the transistor 65 is turned on, the power factor controller 28 produces a voltage drop across high impedance resistor 62, to thereby produce a second trigger voltage 73, which in turn turns on a FET transistor 63. This in turn creates a low impedance path comprising resistor 67 between terminal 29 of the power factor controller 2 and the ground 101. As long as transistor 63 is turned on, the voltage on terminal 29 of power factor controller 28 will be lower than the voltage level required to turn on the power factor controller 28.

When transistor 65 is turned on, this will modify the second trigger voltage 73 thereby turning off transistor 63. The voltage on terminal 29 will then reach the level required to turn on the power factor controller 28, due to the high impedance value of the resistor 62.

Note that the LED lamp 8 will not be turned on until the first trigger voltage 72 is reached and once the lamp 8 is lit, it will stay on until the voltage on input 70 produces a first trigger voltage 72 which is below the transistor 65 trigger voltage (breakdown voltage of the gate electrode 106).

Although the present disclosure describes particular types of transistors in the different circuits of FIGS. 2A, 2B, 3 and 3, it should be kept in mind that these different types of transistors can be substituted or replaced by other available types of transistors.

Although the present invention has been described hereinabove by way of preferred embodiments thereof, it can be modified, without departing from the spirit and nature of the subject invention as defined in the appended claims.

What is claimed is:

1. A power supply unit responsive to alternating voltage and current from an ac source for supplying a dc voltage and current to a light-emitting load, comprising:

a) a rectifier unit rectifying the alternating voltage and current from the ac source and suppling the rectified voltage and current to first and second voltage and current supply lines;

b) a protection fuse through which the alternating current from the ac source is supplied to the rectifier unit:

c) a converter of the rectified voltage and current into the dc voltage and current supplied to the light-emitting load;

d) a fuse blow-out circuit for establishing a short circuit between the first and second voltage and current supply lines to blow out the protection fuse said fuse blow-out circuit comprising:

a resistor and a capacitor connected in series between the first and second lines, said resistor having a given resistance value, and said capacitor having a given capacitance value and a capacitor charge period dependent on said given resistance value and said given capacitance value;

a trigger circuit connected in parallel with the capacitor, and comprising a fist controllable switch member closed in response to the current supplied to the light-emitting load to discharge said capacitor; and a second controllable switch member defining a current path between said first and second lines and closed in response to a given voltage amplitude across the capacitor;

whereby, in the absence of current supplied to the light-emitting load for a duration equivalent to said capacitor charge period, said given voltage amplitude across said capacitor is reached to thereby close said second switch member, establish said current path and provide the short circuit between the first and second lines that will blow out the protection fuse and emulate an open circuit of a defective incandescent lamp; and e) a controller of the converter in response to the recitified voltage on the first and second lines.

2. A power supply unit as in claim 1, wherein said first controllable switch member comprises a first transistor.

3. A power supply unit as in claim 2, wherein said transistor is a first resistor, said capacitor is a first capacitor, and said second controllable switch member comprises:

a) a second resistor connected in series with a second capacitor, said serially interconnected second resistor and second capacitor being connected in parallel with said first capacitor;

b) a semiconductor switch selected from the group consisting of a triac and a silicon bilateral switch, said semiconductor switch connected in parallel with said second capacitor, said semiconductor switch having first and second semiconductor switch electrodes, and a trigger electrode;

c) a Zener diode connected between the trigger electrode and one of the first and second semiconductor switch electrodes, said Zener diode having a breakdown voltage value and being responsive to a voltage across said second capacitor; and d) a thyristor connected between said first and second lines and having a trigger electrode connected to one of said first and second semiconductor switch electrodes;

whereby, in the absence of current supplied to the light-emitting load for a duration equivalent to said capacitor charge period, said given voltage amplitude across said first capacitor is reached to thereby charge said second capacitor is reached to thereby charge said second capacitor through said second resistor until said breakdown voltage value os the Zener diode is reached and said semiconductor switch is triggered to thereby trigger said thyristor, establish through said tyristor said current path, and provide the short circuit between the first and second lines that will blow the protection frst and emulate an open circuit of a defective incandescent lamp.

4. A power supply unit as in claim 3, further comprising a third resistor connected in series with the first resistor between said first and second lines, wherein said first capacitor is connected in parallel with the third resistor.

5. A power supply unit as in claim 2, wherein said second controllable switch member comprises:

a) a second transistor connected in parallel with said capacitor and having a control electrode;

b) a Zener diode connected between the control electrode of the second transistor and said capacitor, having a breakdown voltage, and being responsive to the voltage across the capacitor, and c) a third transistor connected between said first and second lines and having a control electrode activated by the second transistor;

whereby, in the absence of current supplied to the light-emitting toad for a duration equivalent to said capacitor charge period, said given voltage amplitude across said capacitor is reached to successively apply said breakdown voltage to the Zener diode, turn on said second transistor, and turn on said third transistor to establish said current path and provide the short circuit between the first and second lines that will blow out the protection fuse and emulate an open circuit of a defective incandescent lamp.

6. A power supply unit as in claim 5, wherein said resistor is a first resistor, and said fuse blow-out circuit further comprises a second resistor connected in series with said first resistor, said capacitor being connected in parallel with said second resistor.

* * * * *